(12) United States Patent
Hutto

(10) Patent No.: US 8,492,198 B2
(45) Date of Patent: Jul. 23, 2013

(54) MICROELECTRONIC WORKPIECES WITH STAND-OFF PROJECTIONS AND METHODS FOR MANUFACTURING MICROELECTRONIC DEVICES USING SUCH WORKPIECES

(75) Inventor: Kevin W. Hutto, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 24 days.

(21) Appl. No.: 13/088,137

(22) Filed: Apr. 15, 2011

(65) Prior Publication Data

US 2011/0212614 A1    Sep. 1, 2011

Related U.S. Application Data

(62) Division of application No. 11/684,496, filed on Mar. 9, 2007, now Pat. No. 7,928,582.

(51) Int. Cl.
*H01L 21/00* (2006.01)
*H01L 21/44* (2006.01)

(52) U.S. Cl.
USPC .......................... 438/108; 438/109; 438/598

(58) Field of Classification Search
USPC ......................................... 438/108, 109, 598
See application file for complete search history.

(56) References Cited

U.S. PATENT DOCUMENTS

| | | |
|---|---|---|
| 5,121,299 A | 6/1992 | Frankeny et al. |
| 5,245,135 A | 9/1993 | Schreiber et al. |
| 5,245,750 A | 9/1993 | Crumly et al. |
| 5,358,826 A | 10/1994 | Steitz et al. |
| 5,834,848 A * | 11/1998 | Iwasaki ......................... 257/778 |
| 6,005,290 A | 12/1999 | Akram et al. |
| 6,114,221 A | 9/2000 | Tonti et al. |
| 6,137,184 A | 10/2000 | Ikegami |

(Continued)

FOREIGN PATENT DOCUMENTS

| | | |
|---|---|---|
| WO | 9963589 | 12/1999 |
| WO | 0001208 | 1/2000 |

OTHER PUBLICATIONS

Office Action issued Jun. 23, 2011 in People's Republic of China Application No. 200880007270.8, 4 pages.

(Continued)

*Primary Examiner* — James Mitchell
(74) *Attorney, Agent, or Firm* — Perkins Coie LLP

(57) ABSTRACT

Microelectronic workpieces and methods for manufacturing microelectronic devices using such workpieces are disclosed. In one embodiment, a microelectronic assembly comprises a support member having a first side and a projection extending away from the first side. The assembly also includes a plurality of conductive traces at the first side of the support member. Some of the conductive traces include bond sites carried by the projection and having an outer surface at a first distance from the first side of the support member. The assembly further includes a protective coating deposited over the first side of the support member and at least a portion of the conductive traces. The protective coating has a major outer surface at a second distance from the first side of the support member. The second distance is approximately the same as the first distance such that the outer surface of the protective coating is generally co-planar with the outer surface of the bond sites carried by the projection. In several embodiments, a microelectronic die can be coupled to the corresponding bond sites carried by the projection in a flip-chip configuration.

18 Claims, 6 Drawing Sheets

U.S. PATENT DOCUMENTS

| | | | |
|---|---|---|---|
| 6,166,333 A | 12/2000 | Crumly et al. | |
| 6,229,711 B1 | 5/2001 | Yoneda | |
| 6,259,163 B1 | 7/2001 | Ohuchi et al. | |
| 6,271,059 B1 | 8/2001 | Bertin et al. | |
| 6,288,451 B1 | 9/2001 | Tsao | |
| 6,373,273 B2 | 4/2002 | Akram et al. | |
| 6,462,399 B1 | 10/2002 | Akram | |
| 6,528,349 B1 | 3/2003 | Patel et al. | |
| 6,544,813 B1 * | 4/2003 | Lin | 438/107 |
| 6,791,186 B2 | 9/2004 | Sorimachi et al. | |
| 6,803,647 B2 * | 10/2004 | Miyazaki | 257/668 |
| 6,897,088 B2 * | 5/2005 | Hedler et al. | 438/102 |
| 6,975,035 B2 | 12/2005 | Lee | |
| 7,023,088 B2 | 4/2006 | Suzuki et al. | |
| 7,045,899 B2 * | 5/2006 | Yamane et al. | 257/777 |
| 7,190,080 B1 * | 3/2007 | Leu et al. | 257/778 |
| 7,205,645 B2 | 4/2007 | Nakamura et al. | |
| 7,380,338 B2 | 6/2008 | Lee | |
| 7,402,461 B2 * | 7/2008 | Mizukoshi et al. | 438/108 |
| 7,445,958 B2 * | 11/2008 | Suminoe et al. | 438/107 |
| 7,608,921 B2 * | 10/2009 | Pendse | 257/686 |
| 8,125,065 B2 * | 2/2012 | Lee | 257/686 |
| 2002/0180062 A1 * | 12/2002 | Hsieh et al. | 257/778 |
| 2004/0087057 A1 | 5/2004 | Wang et al. | |
| 2006/0223230 A1 * | 10/2006 | Hsu et al. | 438/106 |
| 2007/0138607 A1 | 6/2007 | Mohammed et al. | |
| 2007/0296090 A1 | 12/2007 | Hembree | |
| 2008/0048309 A1 | 2/2008 | Corisis et al. | |
| 2008/0179758 A1 | 7/2008 | Wong et al. | |

OTHER PUBLICATIONS

Office Action issued Mar. 11, 2011 in Republic of Korea Application No. 10-2009-7020860, 6 pages.

International Search Report and Written Opinion for PCT Application No. PCT/US2008/055817, Jul. 16, 2008.

Office Action issued Aug. 17, 2010 in People's Republic of China Application No. 200880007270.8, 17 pages.

Office Action issued Dec. 6, 2011 in Taiwan Application No. 097108234, 5 pages.

\* cited by examiner

MICROELECTRONIC WORKPIECES WITH STAND-OFF PROJECTIONS AND METHODS FOR MANUFACTURING MICROELECTRONIC DEVICES USING SUCH WORKPIECES

CROSS-REFERENCE TO RELATED APPLICATION

This application is a divisional of U.S. application Ser. No. 11/684,496 filed Mar. 9, 2007, now U.S. Pat. No. 7,928,582, which is incorporated herein by reference in its entirety.

TECHNICAL FIELD

The present disclosure is related to microelectronic workpieces and methods for manufacturing microelectronic devices using such workpieces.

BACKGROUND

Semiconductor devices and other types of microelectronic devices can include a microelectronic die attached to a ceramic chip carrier, organic printed circuit board, lead frame, or other type of interposing structure. The dies can be attached to interposing structures using Direct Chip Attach (DCA), flip-chip bonding, or wire-bonding to electrically connect the integrated circuitry in the dies to the wiring of the interposing structures. Typical DCA or flip-chip methods, for example, include depositing very small bumps or balls of a conductive material (e.g., solder) onto the contacts of a die. The bumps are then connected to corresponding contacts or pads on an interposing structure.

FIG. 1, for example, is a partially schematic, isometric illustration of a portion of a conventional flip-chip assembly 10 including a microelectronic die 20 positioned for attachment to a substrate 30. The die 20 includes a plurality of conductive bumps 22 arranged in an array along an active side of the die 20. The substrate 30 includes a front surface 31 and a dielectric mask or layer 32 carried by the front surface 31. The dielectric mask 32 includes an aperture or opening 34 extending lengthwise along a medial portion of the mask 32. The substrate 30 also includes a plurality of contacts or traces 36 located at the front surface 31 and arranged in a pattern corresponding at least in part to the arrangement of conductive bumps 22 on the die 20. A solder ball 38 or other conductive coupler is disposed on each contact 36. The contacts 36 and solder balls 38 are accessible through the aperture 34 for coupling to corresponding conductive bumps 22. More specifically, during attachment the die 20 is inverted or "flipped" such that the active side bearing the conductive bumps 22 is superimposed with corresponding solder balls 38 and/or contacts 36 on the substrate 30, and a suitable reflow process is used to electrically and mechanically connect the die 20 to the substrate 30. An underfill material (not shown) may then be disposed in the gap between the die 20 and substrate 30 to protect the components from environmental factors (e.g., moisture, particulates, static electricity, and physical impact) and to enhance the mechanical attachment of the die 20 to the substrate 30.

The underfill material is typically dispensed into the gap by injecting the underfill material along one or two sides of the flip-chip device, and the underfill material is drawn into the gap by capillary effects. One potential drawback with the foregoing approach, however, is that it may result in a vulnerable mechanical connection between the die 20 and the substrate 30. For example, when the underfill material flows into the gap between the components, air bubbles, air pockets, and/or voids may form within the underfill material. The trench region around the aperture 34 is particularly susceptible to such voids because of the large volume of underfill material required to fill this area. During subsequent high temperature processes, the air trapped in these regions may expand and force the die 20 away from the substrate 30, damaging the mechanical and/or electrical connections between these components. Another drawback with this approach is that the underfilling method may be very time-consuming because the relatively large gap between the die 20 and substrate 30 takes time to fill, and the volume of fill material in the gap takes time to cure. This can significantly increase the overall time required for manufacturing the assembly.

Another drawback with the foregoing approach is that not all the solder balls 38 may make contact with the corresponding conductive bumps 22 of the die 20. For example, the solder balls 38 must typically be fairly large (e.g., about 80 $\mu$m) to extend between the bumps 22 and the corresponding contacts 36. In some cases, however, some of the solder balls 38 may be misshapen or smaller than normal and, accordingly, a gap may exist between these solder balls 38 and the corresponding conductive bumps 22. During the reflow process, this gap may not seal and the result may be an open circuit between the die's conductive bump 22 and the corresponding solder ball 38 and contact 36.

In light of the foregoing potential drawbacks, existing processes are time-consuming and may create at least some faulty packaged devices. In order to increase the efficiency and overall throughput of the manufacturing process for such devices, it is desirable to increase the robustness of both the mechanical and electrical connections between microelectronic dies and the structures to which they are attached.

DETAILED DESCRIPTION

Specific details of several embodiments of the disclosure are described below with reference to microelectronic workpieces and methods for manufacturing microelectronic devices using such workpieces. The microelectronic devices described below include a single microelectronic die attached to a support member, but in other embodiments the microelectronic devices can have two or more stacked microelectronic dies electrically coupled to a support member. The microelectronic devices can include, for example, micromechanical components, data storage elements, optics, read/write components, or other features. The microelectronic dies can be SRAM, DRAM (e.g., DDR-SDRAM), flash-memory (e.g., NAND flash-memory), processors, imagers, and other types of devices. Substrates can be semiconductive pieces (e.g., doped silicon wafers, gallium arsenide wafers, or other semiconductor wafers), non-conductive pieces (e.g., various ceramic substrates), or conductive pieces. Moreover, several other embodiments of the invention can have configurations, components, or procedures different than those described in this section. A person of ordinary skill in the art, therefore, will accordingly understand that the invention may have other embodiments with additional elements, or the invention may have other embodiments without several of the elements shown and described below with reference to FIGS. 2A-6.

Figure 2A:
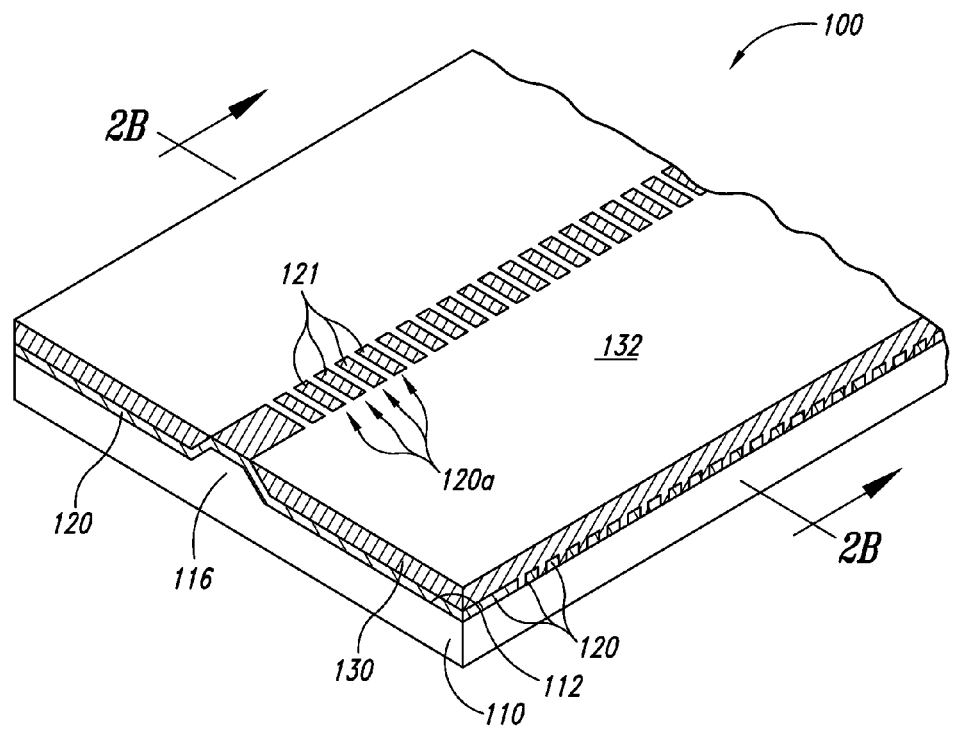
FIG. 2A is partially schematic, isometric illustration of a portion of a microelectronic workpiece configured in accordance with an embodiment of the invention.

FIG. 2A is partially schematic, isometric illustration of a portion of a microelectronic workpiece 100 configured in accordance with an embodiment of the invention. More specifically, FIG. 2A illustrates the workpiece 100 at an intermediate processing stage before a semiconductor component has been attached to the workpiece 100. In previous processing steps, a number of structures have been formed on and/or in the workpiece 100. The workpiece 100, for example, can include a substrate 110 having a first side 112, a projection or ridge 116 extending away from the first side 112, and a plurality of conductive traces 120 disposed on and/or in the substrate 110. One or more conductive traces 120 extend over or are otherwise carried by the projection 116. The conductive traces 120 are conductive lines arranged in a desired pattern on the substrate 110 and configured to transmit signals to and/or from one or more external devices attached to the workpiece 100. The workpiece 100 further includes a protective coating or layer 130 (e.g., a solder mask) disposed on the substrate 110 and over at least a portion of the conductive traces 120. The protective coating 130 has an outer (e.g., upper) surface 132 at a desired distance from the first side 112 of the substrate 110. More specifically, as discussed in greater detail below, the outer surface 132 can be formed at a distance from the first side 112 corresponding at least in part to the height of the projection 116 such that the outer surface 132 is approximately co-planar or flush with an outer surface 121 of the one or more portions of the conductive traces 120 (shown in FIG. 2A as exposed conductive bond sites or trace portions 120a) carried by the projection 116.

Figure 2B:
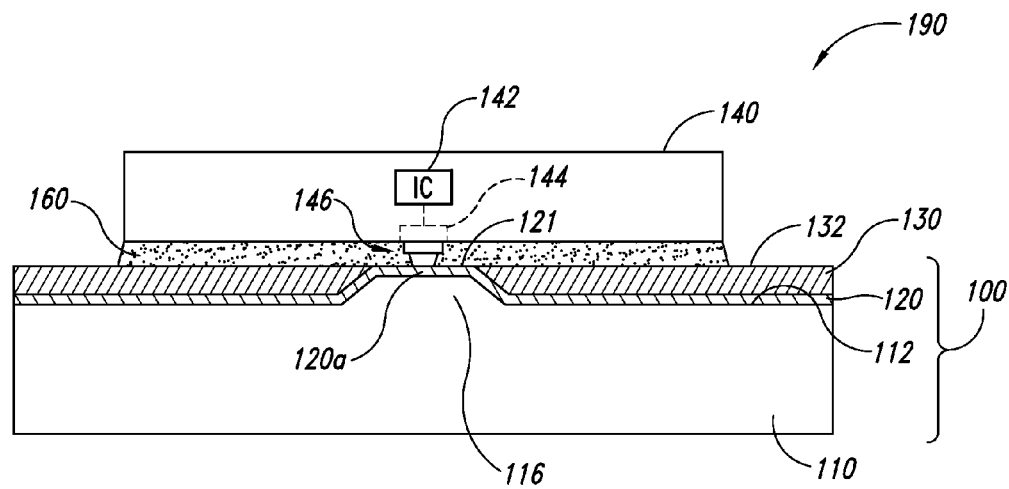
FIG. 2B is a side cross-sectional view taken substantially along line 2B-2B of FIG. 2A with a microelectronic die attached to the workpiece.

FIG. 2B is a side cross-sectional view of the workpiece 100 taken substantially along line 2B-2B of FIG. 2A at a subsequent processing stage in which a microelectronic die 140 has been physically and electrically coupled to corresponding conductive traces 120 of the workpiece 100 in a flip-chip configuration to form a packaged microelectronic device 190. The die 140 can be a processor, a memory device (e.g., a DRAM or flash memory device), an imager, a sensor, a filter, or other type of microelectronic device. The die 140 can include integrated circuitry 142 (shown schematically), a plurality of terminals 144 (only one is shown in broken lines) electrically coupled to the integrated circuitry 142, and a plurality of conductive bumps or stud bumps 146 projecting from corresponding terminals 144. The conductive bumps 146 are configured to engage the exposed bond sites 120a at the outer surface 132 of the protective coating 130 to electrically and physically couple the die 140 to the workpiece 100. In several embodiments, the device 190 can further include an underfill material 160 disposed between the die 140 and the workpiece 100 to help attach the die 140 to the workpiece 100 and to protect the conductive bumps 146 and corresponding bond sites 120a from contamination (e.g., moisture, particulates, etc.).

Figure 1:
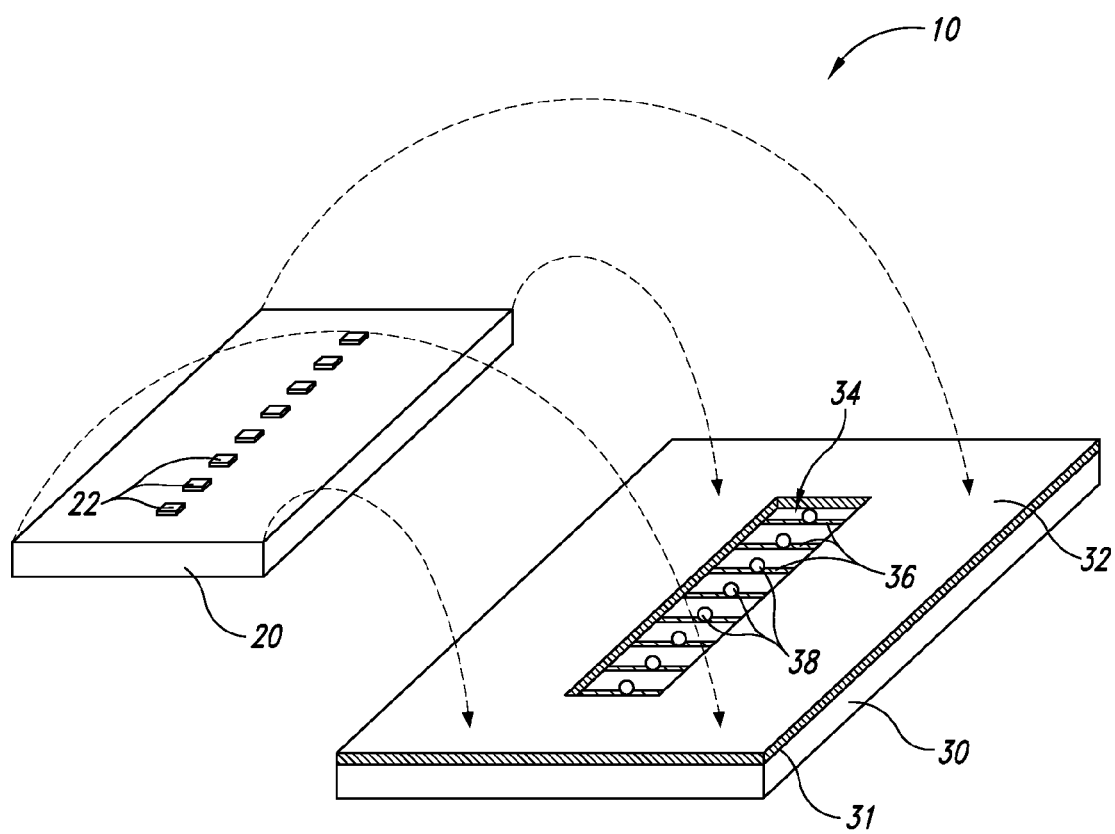
FIG. 1 is a partially schematic, isometric illustration of a conventional flip-chip assembly configured in accordance with one aspect of the prior art.

As discussed previously (and as shown in both FIGS. 2A and 2B), the outer surface 132 of the protective coating 130 is approximately co-planar or flush with the outer surfaces 121 of the bond sites 120a on the projection 116. Unlike the conventional flip-chip assemblies described previously with reference to FIG. 1 (which include apertures or trenches in an outer surface of the support member), the generally planar surface across the entire upper portion of the workpiece 100 reduces or eliminates the chances for air bubbles, air pockets, and/or voids to form within the underfill material 160 because there are no large cavities or open spaces on the upper surface of the workpiece 100 that require excessive amounts of underfill material 160. By reducing the amount of underfill material 160 required to fill the gap between the components, the likelihood of voids in the underfill material 160 is also reduced.

Several embodiments of the microelectronic device 190 described above may provide improved package reliability and robustness as compared with conventional flip-chip devices. As discussed previously, the air trapped in voids or cavities within the underfill material in conventional flip-chip assemblies can expand and force the die away from the substrate, damaging the mechanical and/or electrical connections between these components. This in turn often leads to failure or malfunction of such devices. In the device 190 shown in FIG. 2B, however, the generally planar upper surface of the workpiece 100 significantly reduces the likelihood that such voids may form, thereby reducing and/or eliminating the tendency for the mechanical and/or electrical connections in the device 190 to fail.

An embodiment of the microelectronic device 190 described above with reference to FIGS. 2A and 2B includes a support member 110 having a first side 112 and a projection 116 extending away from the first side 112. The device 190 also includes a plurality of conductive traces 120 at the first side 112 of the support member 110. Some of the conductive traces 120 include bond sites 120a carried by the projection 116 and having an outer surface 121 at a first distance from the first side 112 of the support member 110. The device 190 further includes a protective coating 130 deposited over the first side 112 of the support member 110 and at least a portion of the conductive traces 120. The protective coating 130 has a major outer surface 132 at a second distance from the first side 112 of the support member 110. The second distance is approximately the same as the first distance such that the outer surface 132 of the protective coating 130 is generally co-planar with the outer surface 121 of the bond sites 120a carried by the projection 116.

In the embodiment illustrated in FIGS. 2A and 2B, formation of the workpiece 100 is complete. FIGS. 3A-5 described below illustrate various embodiments of microelectronic workpieces and methods for forming such workpieces. Although the following description does not show the workpieces attached to semiconductor components (e.g., microelectronic dies) or other external devices, it will be appreciated that the workpieces described below can be electrically and physically coupled to a variety of different semiconductor components.

Figure 3A:
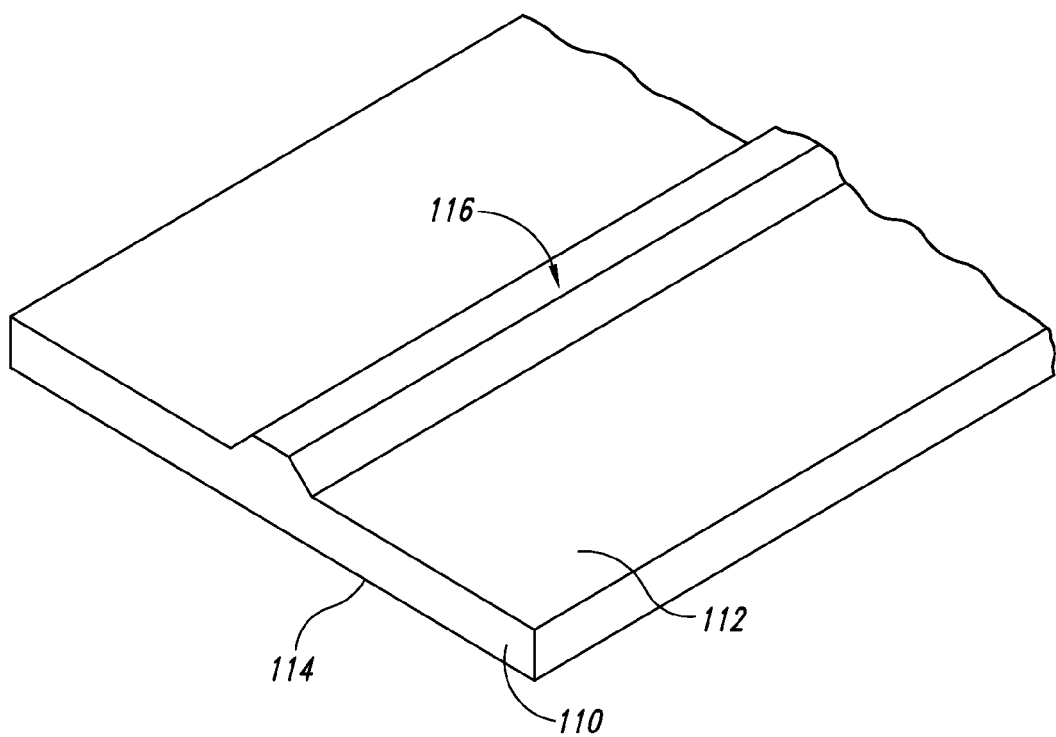
FIGS. 3A-3C illustrate stages in a method for forming a microelectronic workpiece configured in accordance with an embodiment of the invention.
Figure 3B:
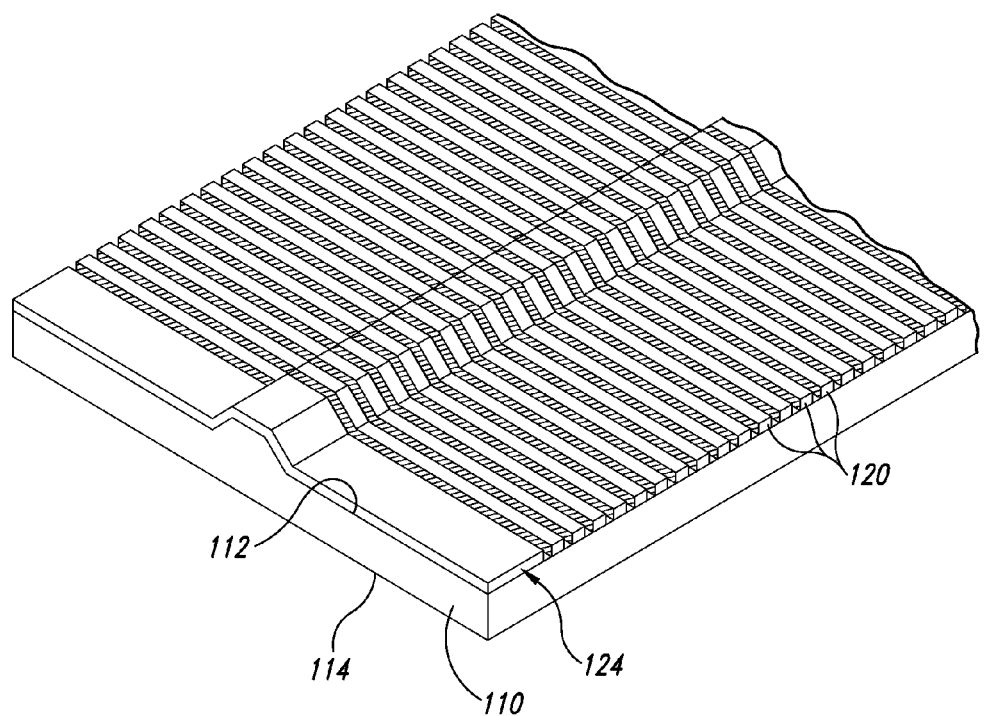
Figure 3C:
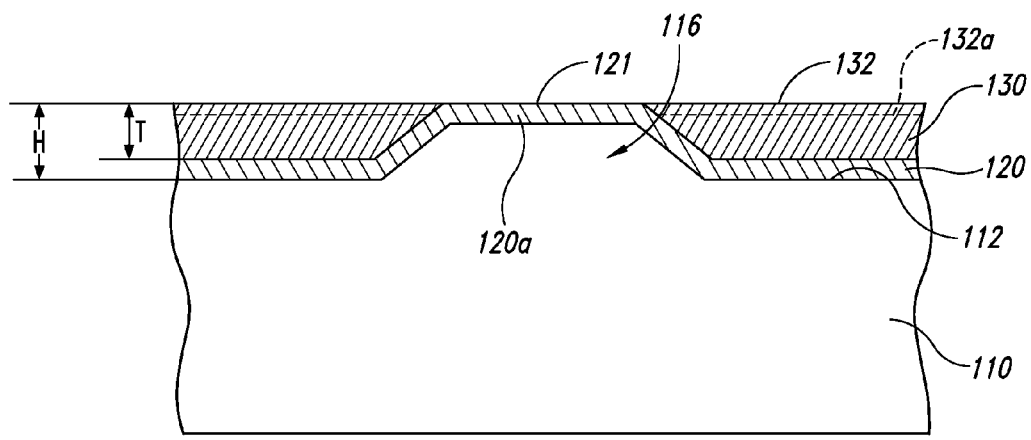

FIGS. 3A-3C illustrate stages in a method for forming the microelectronic workpiece 100 in accordance with an embodiment of the invention. FIG. 3A, more specifically, is a partially schematic, isometric view of the workpiece 100 at an initial stage before any external materials have been deposited on or otherwise attached to the substrate 110. The substrate 110 can include the first side 112 and a second side 114 facing opposite the first side 112. The substrate 110 can include an interposer substrate, a printed circuit board, a lead frame, or another suitable support member. The substrate 110 can be composed of polymeric materials (e.g., resins, silicones, etc.), organic materials other than polymeric materials, or other suitable non-ceramic dielectric materials. The selection of a material for the substrate 110, for example, can be based on the particular application(s) for which the resulting microelectronic device will be used.

In previous processing steps, the projection 116 was formed at the first side 112 of the substrate 110. As shown in FIG. 3A, the projection 116 is a ridge or stand-off extending lengthwise along a medial portion of the substrate 110. In this embodiment, the projection 116 is an integral component of the substrate 110 and is composed of the same material as the substrate 110. In other embodiments, however, the projection 116 may not be integral with the substrate 110 and/or may be composed of a different material than the substrate 110, as described in greater detail below with reference to FIGS. 4A-4C. The projection 116 can be formed at the first side 112 using a stamping process, a compression molding process, a deposition process, or another suitable technique. The projection 116 can have a variety of different shapes and configurations based, at least in part, upon the configuration of a device or component to be attached to the workpiece 100, the material of which the substrate 110 is composed, and/or the desired configuration of conductive traces (not shown) upon the substrate 110. For example, the height of the projection 116 can vary depending upon the particular configuration (e.g., thickness, etc.) of the conductive traces (not shown) disposed on the substrate 110.

Referring next to FIG. 3B, a conductive (e.g., metal) layer 124 is deposited onto the first side 114 of the substrate 110 and patterned and etched to form the conductive traces 120. The conductive layer 124 can be composed of Cu, Au, Ag, Al, Pd, and/or another suitable material or combination of materials having the desired properties. The conductive layer 124 can be applied onto the substrate 110 using a variety of different techniques (e.g., stamping, physical vapor deposition (PVD), plating, chemical vapor deposition (CVD), etc.) depending on the composition of the material and/or the configuration of the substrate 110.

As discussed above, the conductive traces 120 are conductive lines that are arranged on the substrate 110 in a variety of different patterns, and can be formed on and/or in the first side 112 of the substrate and over the projection 116. For purposes of illustration, the conductive traces 120 in FIG. 2B are shown as a series of generally parallel strips or ridges, and include a plurality of interstitial regions between the individual traces. In other embodiments, however, the conductive traces 120 can have a variety of other configurations and/or arrangements on the substrate 110.

FIG. 3C is a side cross-sectional view illustrating a portion of the workpiece 100 after the protective coating 130 (e.g., solder mask) is formed at the first side 112 of the substrate 110. The protective coating 130 is typically composed of a dielectric material and may be deposited onto the substrate 110 using deposition processes (e.g., CVD or PVD), three-dimensional stereolithography processes, spin-on techniques, spraying techniques, molding, or other processes. Referring to FIGS. 3B and 3C together, the protective coating 130 can (a) fill the interstitial regions between the individual conductive traces 120 to electrically insulate each trace 120, and (b) cover the exposed portions of the first side 112 of the substrate 110 and the conductive traces 120 and protect them from environmental factors (e.g., moisture, particulates, physical damage, etc.).

As discussed previously, the protective coating 130 has an outer surface 132 at a desired distance from the first side 112 of the substrate 110. The outer surface 132 can be formed at a precise distance from the first side 112 by planarizing the protective coating 130 using chemical-mechanical planarization or another suitable grinding process. In several embodiments, however, the outer surface 132 can be formed at the desired distance from the substrate 130 in the deposition process without planarizing or grinding the protective coating 130.

As illustrated in FIG. 3C, the projection 116 and the bond sites 120a combine to have a height H above the front side 112 of the substrate 110. The protective coating 130 is accordingly formed with a corresponding thickness T such that the outer surface 132 of the protective coating 130 is approximately co-planar or flush with the outer surface 121 of the bond sites 120a. In this way, the workpiece 100 has a generally uniform cross-sectional dimension across the entire workpiece 100, and there are no large cavities, trenches, or depressions in the upper surface of the workpiece 100.

In other embodiments, however, the protective layer 130 may have an outer surface 132a (shown in broken lines) slightly recessed or below the outer surface 121 of the bond sites 120a. Although the outer surface 132a is not precisely co-planar with the outer surface 121 in such instances, there is not a substantial difference between the two surfaces. Accordingly, the upper surface across the entire workpiece 100 is generally planar and does not include any large cavities or openings that may require significant amounts of underfill material. Thus, as used herein, the term "generally planar" can be defined as (a) substantially planar and/or (b) having some minor deviation from planarity (e.g., within the thickness of the individual bond sites 120a).

Figure 4A:
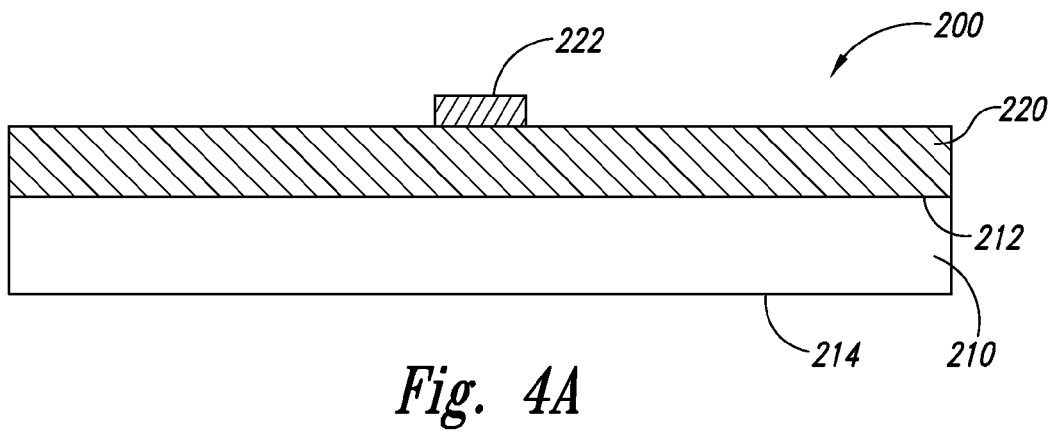
FIGS. 4A-4C illustrate stages in a method for forming a microelectronic workpiece configured in accordance with another embodiment of the invention.
Figure 4B:
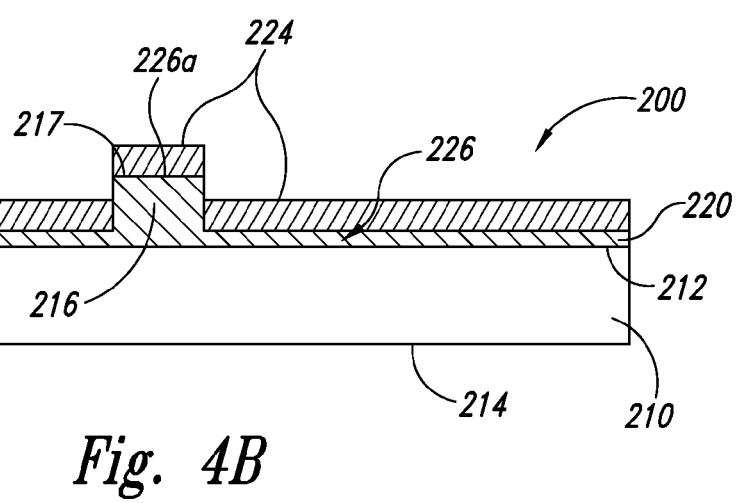
Figure 4C:
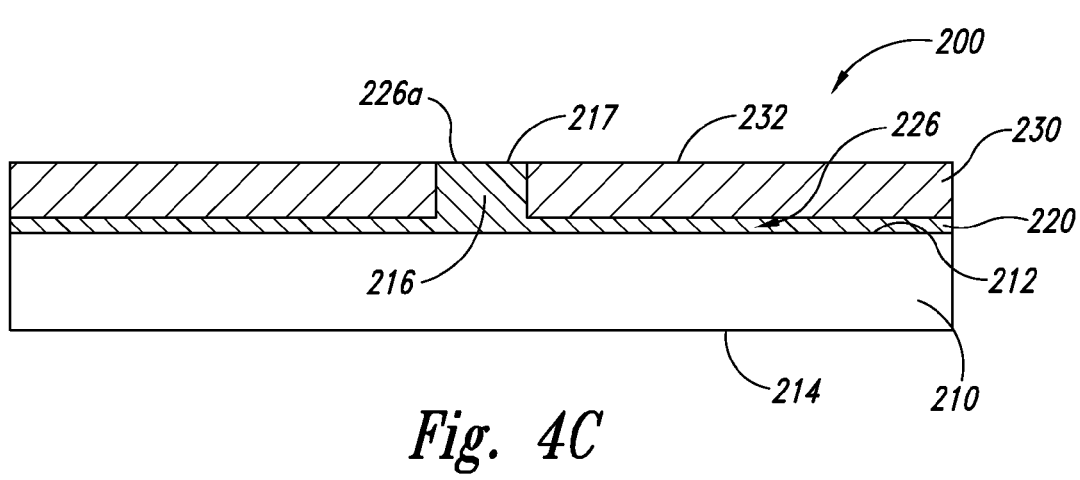

FIGS. 4A-4C illustrate stages in a method for forming a microelectronic workpiece configured in accordance with another embodiment of the invention. FIG. 4A, more specifically, is a partially schematic, side cross-sectional view of a workpiece 200 at an initial stage of the process. The workpiece 200 can include a substrate 210 having a first side 212 and a second side 214 facing opposite the first side 212. The substrate 210 can be composed of materials similar to the substrate 110 discussed above with reference to FIG. 3A. In other embodiments, however, the substrate 210 can be composed of other materials. The substrate 210 differs from the substrate 110 described above with reference to FIG. 3A in that the substrate 210 does not include an integral projection, like the projection 116 of the substrate 110. Rather, as discussed below, a projection is formed on the substrate 210 using materials different from the material of which the substrate 210 is composed.

In previous processing steps, a conductive layer 220 was deposited onto the first side 212 of the substrate 210. The conductive layer 220 can include Cu, Au, Ag, Al, Pd or other suitable conductive materials. The conductive layer 220 can be deposited onto the substrate 210 using processes similar to those used to deposit the conductive layer 124 described above with reference to FIG. 3B. After depositing the conductive layer 220, a first mask 222 is applied over the conductive layer 220 and patterned as shown in FIG. 4A. The first mask 222 can be a layer of resist or another suitable photoactive material that is patterned according to the desired configuration of a projection or ridge to be formed on the substrate, as described in greater detail below.

Referring next to FIG. 4B, the conductive layer 220 is etched using a first etching process to form a projection or ridge 216 at a medial portion of the substrate 210. The projection 216 can have similar dimensions to the projection 116 described above with reference to FIGS. 2A-3C. For example, an outer (e.g., upper) surface 217 of the projection 216 can have a distance from the first side 212 of the substrate 210 similar to the distance between an outer surface of the projection 116 and the first side 112 of the substrate 110 (as best seen in FIG. 2B). In other embodiments, however, the projection 216 can have different dimensions and/or a different configuration. After etching the conductive layer 220, a second mask 224 is applied over the conductive layer 220 and patterned. The second mask 224 can be patterned according to a desired arrangement of (a) conductive traces or lines at the first side 212 of the substrate 210, and (b) conductive bond sites on the projection 216. After patterning the second mask 224, the conductive layer 220 is etched using a second etching process to form a plurality of conductive traces 226 on the substrate 210 and a plurality of bond sites 226a on the projection 216. The second etching process selectively removes material from the conductive layer 220, but not the substrate 210. The substrate 210 can accordingly act as an etch-stop for the second etching process.

Referring next to FIG. 4C, a protective coating or layer 230 (e.g., a solder mask) is deposited onto the workpiece 200 and over the conductive traces 226. The protective coating 230 can be generally similar to the protective coating 130 described above. For example, the protective coating 230 can include an outer surface 232 formed at a precise distance from the first side 212 of the substrate 210 using a planarization process or another suitable technique such that the outer surface 232 is generally co-planar with the outer surface 217 of the projection 216. The workpiece 200 accordingly has a generally planar, smooth upper surface that does not include any large openings, recesses, or cavities.

Figure 5:
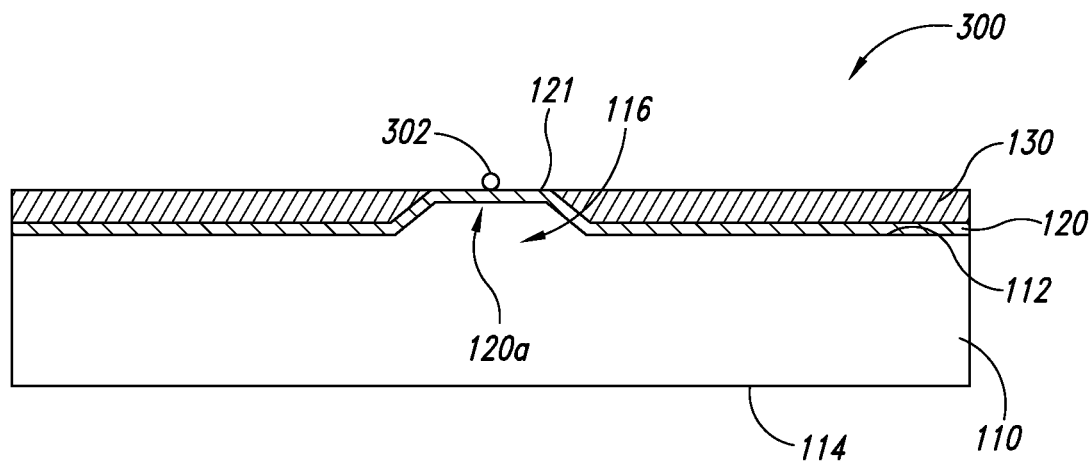
FIG. 5 is a partially schematic, side cross-sectional view of a microelectronic workpiece configured in accordance with still another embodiment of the invention.

FIG. 5 is a partially schematic, side cross-sectional view of a microelectronic workpiece 300 configured in accordance with still another embodiment of the invention. Like reference numbers refer to like components in FIGS. 2A-3C and 5. The workpiece 300 differs from the workpieces 100 and 200 described above in that the workpiece 300 includes one or more conductive couplers or elements 302 (only one is shown) attached to corresponding bond sites or trace portions 120a. The conductive couplers 302 can include, for example, gold bumps or "pikes," solder balls, conductive paste, or another suitable conductive element. The conductive couplers 302 are optional elements that may not be included in some embodiments. In subsequent processing steps, a microelectronic die or other semiconductor component (not shown) can be attached to the workpiece 200 (FIG. 4C) or the workpiece 300 in a flip-chip configuration.

Figure 6:
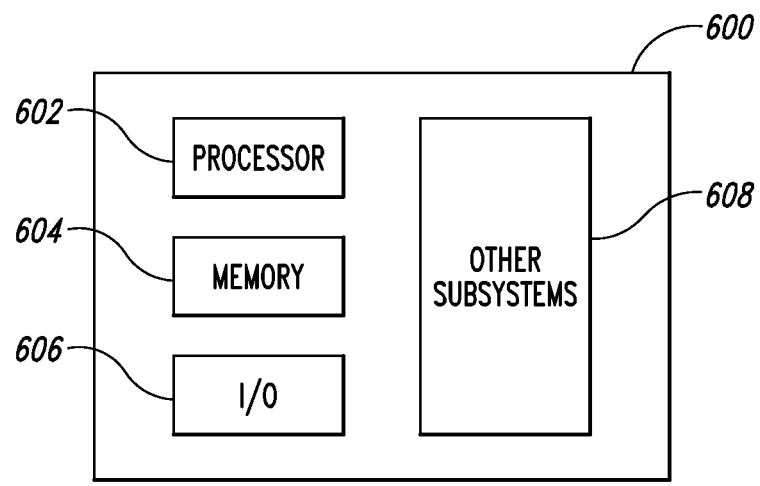
FIG. 6 is a schematic illustration of a system in which the microelectronic workpiece may be incorporated.

Any one of the packaged microelectronic devices described above with reference to FIGS. 2A-5 can be incorporated into any of a myriad of larger and/or more complex systems, a representative example of which is a system 600 shown schematically in FIG. 6. The system 600 can include a processor 602, a memory 604 (e.g., SRAM, DRAM, flash, and/or other memory device), input/output devices 606, and/or other subsystems or components 608. The microelectronic devices described above with reference to FIGS. 2A-5 may be included in any of the components shown in FIG. 6. The resulting system 600 can perform any of a wide variety of computing, processing, storage, sensing, imaging, and/or other functions. Accordingly, representative systems 600 include, without limitation, computers and/or other data processors, for example, desktop computers, laptop computers, Internet appliances, hand-held devices (e.g., palm-top computers, wearable computers, cellular or mobile phones, personal digital assistants, etc.), multi-processor systems, processor-based or programmable consumer electronics, network computers, and mini computers. Other representative systems 600 include cameras, light or other radiation sensors, servers and associated server subsystems, display devices, and/or memory devices. Components of the system 600 may be housed in a single unit or distributed over multiple, interconnected units (e.g., through a communications network). The components of the system 600 can accordingly include local and/or remote memory storage devices, and any of a wide variety of computer-readable media.

From the foregoing, it will be appreciated that specific embodiments of the invention have been described herein for purposes of illustration, but that various modifications may be made without deviating from the invention. For example, specific elements of any of the foregoing embodiments can be combined or substituted for other elements in other embodiments. In particular, for example, the projections or ridges on the workpieces may have other dimensions, shapes, and/or configurations in addition to the projections 116 and 216 described above. Accordingly, the invention is not limited except as by the appended claims.

I claim:

1. A method of forming a microelectronic assembly, the method comprising:
   constructing a stand-off at a first side of a support member, wherein the stand-off extends away from the first side;
   forming a plurality of conductive traces at the first side of the support member, wherein at least a portion of the conductive traces include a bond site carried by the stand-off, and wherein at least some of the conductive traces have a generally uniform thickness across the entire or substantially the entire first side of the support member;
   forming a protective coating over the first side of the support member and at least a portion of the conductive traces; and before attaching another substrate or microelectronic component to the support member planarizing the protective coating to have a generally planar major outer surface, wherein at least a portion of the bond sites carried by the stand-off are exposed at the outer surface of the protective coating and are generally flush with the outer surface of the protective coating.

2. The method of claim 1, further comprising attaching and electrically coupling a plurality of conductive bumps on a microelectronic die to corresponding exposed bond sites at the outer surface of the protective coating.

3. The method of claim 2 wherein attaching and electrically coupling the microelectronic die to the bond sites comprises attaching the die in a flip-chip configuration.

4. The method of claim 2, further comprising applying a fill material between the microelectronic die and the support member after attaching and electrically coupling the microelectronic die and the support member.

5. The method of claim 2, further comprising attaching a plurality of gold bumps to respective exposed bond sites at the outer surface of the protective coating, and wherein attaching and electrically coupling the microelectronic die to the bond sites comprises coupling the conductive bumps on the microelectronic die to corresponding gold bumps.

6. The method of claim 1 wherein constructing a stand-off at a first side of a support member comprises constructing a stand-off that is an integral component of the support member.

7. The method of claim 6 wherein constructing a stand-off that is an integral component of the support member comprises constructing the stand-off using at least one of a stamping process, a compression molding process, and a deposition process.

8. The method of claim 6 wherein constructing a stand-off at a first side of a support member comprises constructing a stand-off that is composed of the same material as the support member.

9. The method of claim 1 wherein forming a plurality of conductive traces at the first side of a support member comprises forming a plurality of conductive traces composed of at least one of Cu, Au, Ag, Al, and Pd.

10. The method of claim 1 wherein constructing a stand-off at a first side of a support member comprises constructing a stand-off at a first side of an interposer substrate.

11. The method of claim 1 wherein forming a protective coating over the first side of the support member comprises forming a solder mask over the first side of the support member.

12. A method of forming a microelectronic assembly, the method comprising:
   constructing a stand-off at a first side of a support member, wherein the stand-off extends away from the first side, and wherein constructing a stand-off at a first side of a support member comprises:
      depositing a conductive layer onto the first side of the support member; and
      applying a layer of resist onto the conductive layer and etching the conductive layer to form the stand-off;
   forming a plurality of conductive traces at the first side of a support member, wherein at least a portion of the conductive traces include a bond site carried by the stand-off, and wherein at least some of the conductive traces have a generally uniform thickness across the entire or substantially the entire first side of the support member; and
   forming a protective coating over the first side of the support member and at least a portion of the conductive traces, the protective coating having a generally planar major outer surface, and wherein at least a portion of the bond sites carried by the stand-off are exposed at the outer surface of the protective coating and are generally flush with the outer surface of the protective coating before attaching another substrate or microelectronic component to the support member.

13. The method of claim 12 wherein the layer of resist is a first layer of resist and the etching process is a first etching process, and wherein forming a plurality of conductive traces at the first side of a support member comprises:
   depositing a second layer of resist on the conductive layer after the first etching process; and
   etching the conductive layer with a second etching process to form (a) the plurality of conductive traces at the first side of the support member, and (b) the corresponding bond sites carried by the stand off.

14. A method of forming a microelectronic assembly, the method comprising:
   constructing a stand-off at a first side of a support member, wherein the stand-off extends away from the first side;
   forming a plurality of conductive traces at the first side of a support member, wherein at least a portion of the conductive traces include a bond site carried by the stand-off, and wherein at least some of the conductive traces have a generally uniform thickness across the entire or substantially the entire first side of the support member;
   forming a protective coating over the first side of the support member and at least a portion of the conductive traces, the protective coating having a generally planar major outer surface, and wherein at least a portion of the bond sites carried by the stand-off are exposed at the outer surface of the protective coating and are generally flush with the outer surface of the protective coating; and
   planarizing the upper surface of the protective coating after applying the protective coating to the support member to form the upper surface at a desired height above the first side of the support member before attaching another substrate or microelectronic component to the support member.

15. The method of claim 1 wherein forming a protective coating over the first side of the support member comprises forming the protective coating using at least one of vapor deposition processes, three-dimensional stereolithography processes, spin-on techniques, spraying techniques, and molding processes.

16. A method of forming a microelectronic assembly, the method comprising:
   forming a projection at a first side of a support member, wherein the projection extends away from the first side;
   forming a plurality of conductive traces at the first side of the support member, wherein at least a portion of the conductive traces include a bond site carried by the projection, wherein the bond site includes a first outer surface that faces away from the projection, and wherein at least some of the conductive traces have a generally uniform thickness across the entire or substantially the entire first side of the support member;
   forming a protective coating over the first side of the support member and at least a portion of the conductive traces; and
   planarizing the protective coating to have a second outer surface that is co-planar with at least a portion of the first outer surfaces of the bond sites carried by the projection before attaching another substrate or microelectronic component to the support member.

17. The method of claim 16 wherein planarizing the protective coating further comprises planarizing the protective coating to have a generally planar major outer surface that includes the second outer surface of the protective coating.

18. The method of claim 16 wherein planarizing the protective coating further comprises planarizing the protective coating such that the first outer surfaces of the bond sites are exposed at the second outer surface of the protective coating.

* * * * *